United States Patent
Lamoreux et al.

(10) Patent No.: US 9,146,262 B2
(45) Date of Patent: Sep. 29, 2015

(54) NON-CONTACT, HAND-HELD VOLTAGE DETECTOR

(71) Applicant: Greenlee Textron Inc., Rockford, IL (US)

(72) Inventors: Zachary Lamoreux, Lanark, IL (US); Richard A Duke, Rock Falls, IL (US)

(73) Assignee: TEXTRON INNOVATIONS INC., Providence, RI (US)

( * ) Notice: Subject to any disclaimer, the term of this patent is extended or adjusted under 35 U.S.C. 154(b) by 186 days.

(21) Appl. No.: 13/738,093

(22) Filed: Jan. 10, 2013

(65) Prior Publication Data

US 2014/0035557 A1 Feb. 6, 2014

Related U.S. Application Data

(60) Provisional application No. 61/678,921, filed on Aug. 2, 2012.

(51) Int. Cl.
*G01R 31/02* (2006.01)
*G01R 19/155* (2006.01)
*G01R 1/067* (2006.01)

(52) U.S. Cl.
CPC .......... *G01R 19/155* (2013.01); *G01R 1/06788* (2013.01)

(58) Field of Classification Search
CPC .......... G01R 19/155; G01R 1/02; G01R 31/00
USPC ...................................... 324/72.5
See application file for complete search history.

(56) References Cited

U.S. PATENT DOCUMENTS

| | | | | |
|---|---|---|---|---|
| 4,259,635 A | * | 3/1981 | Triplett | 324/149 |
| 4,952,869 A | * | 8/1990 | Tuttle | 324/126 |
| D355,861 S | | 2/1995 | Walsh | |
| 5,703,928 A | | 12/1997 | Galloway et al. | |
| 5,877,618 A | | 3/1999 | Luebke et al. | |
| D409,929 S | | 5/1999 | Fisher et al. | |
| 5,947,755 A | * | 9/1999 | Conway | 439/148 |
| 5,952,820 A | * | 9/1999 | Thrasher et al. | 324/119 |
| 6,137,285 A | * | 10/2000 | Walsten et al. | 324/133 |
| 6,422,880 B1 | * | 7/2002 | Chiu | 439/137 |
| 6,452,966 B1 | | 9/2002 | Kaiser et al. | |
| 6,512,361 B1 | | 1/2003 | Becker | |
| 6,703,562 B1 | * | 3/2004 | Pacheco | 174/66 |
| 6,831,452 B2 | * | 12/2004 | McTigue | 324/72.5 |
| 7,336,063 B1 | | 2/2008 | Bierer | |

(Continued)

FOREIGN PATENT DOCUMENTS

CA 2607922 2/2009

OTHER PUBLICATIONS

Toolup.com, Greenlee GT-12 Non-Contact Self-Testing Voltage Detector, one page, www.toolup.com/greenlee_gt-12_non-contact-self-testing-voltage-detector.aspx, Jul. 16, 2012.

(Continued)

*Primary Examiner* — Benjamin M Baldridge
(74) *Attorney, Agent, or Firm* — Klintworth & Rozenblat IP LLC

(57) ABSTRACT

A non-contact, hand-held voltage detector is used to determine if AC voltage is present in a tamper-resistant receptacle. The voltage detector includes a pair of pins to open both shutters of the tamper-resistant receptacle.

12 Claims, 8 Drawing Sheets

(56) References Cited

U.S. PATENT DOCUMENTS

| | | |
|---|---|---|
| D571,240 S | 6/2008 | Chun |
| 7,510,412 B1 * | 3/2009 | Valentin .................. 439/145 |
| 7,733,078 B2 | 6/2010 | Duke |
| D625,211 S | 10/2010 | Chun |
| D637,926 S | 5/2011 | Chun |
| 7,948,227 B2 * | 5/2011 | Beckmann ................. 324/72.5 |
| D642,943 S | 8/2011 | Laurino et al. |
| D661,605 S * | 6/2012 | Laurino et al. ................ D10/78 |
| 2004/0247300 A1 * | 12/2004 | He et al. .................... 392/390 |
| 2008/0013932 A1 * | 1/2008 | He et al. .................... 392/390 |
| 2009/0212964 A1 * | 8/2009 | Hibma et al. ................ 340/657 |
| 2010/0254149 A1 | 10/2010 | Gill |

OTHER PUBLICATIONS

Greenlee, a Textron Company, Detector, Voltage Non-Contact (GT-12), (5 pages), www.greenlee.com/products/DETECTOR%2540c VOLTAGE-NON%2540dCONT . . . , Jul. 24, 2012.

* cited by examiner

US 9,146,262 B2

NON-CONTACT, HAND-HELD VOLTAGE DETECTOR

This application claims the domestic benefit of provisional application Ser. No. 61/678,921, filed on Aug. 2, 2012, which disclosure is herein incorporated by reference in its entirety.

FIELD OF THE INVENTION

This invention is generally directed to a non-contact, hand-held voltage detector which is used to determine if AC voltage is present in a tamper-resistant receptacle.

BACKGROUND OF THE INVENTION

Tamper-resistant receptacles 20 are known in the art, and some jurisdictions in the United States have required usage of such tamper-resistant receptacles 20 since 2008. As shown in FIGS. 1 and 2, the tamper-resistant receptacle 20 has two shutters 22a, 22b that are spring loaded which allows a two-pronged plug 24 to enter, but resists access to items with a single prong, such as a key. Such a tamper-resistant receptacle 20 is disclosed in U.S. Pat. No. 7,510,412, the disclosure of which is incorporated by reference. As is known in the art, when a two-pronged plug 24 is inserted, both shutters 22a, 22b move toward each other to allow access to the electrical components in the receptacle 20. When a single-pronged item, such as a key, is inserted, the shutters 22a, 22b do not move.

A voltage detector is provided herein which opens both shutters 22a, 22b to enable a user to detect voltage in such a tamper-resistant receptacle 20.

SUMMARY OF THE INVENTION

A non-contact, hand-held voltage detector is used to determine if AC voltage is present in a tamper-resistant receptacle. The voltage detector includes a pair of pins to open both shutters of the tamper-resistant receptacle.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT

Figure 1:
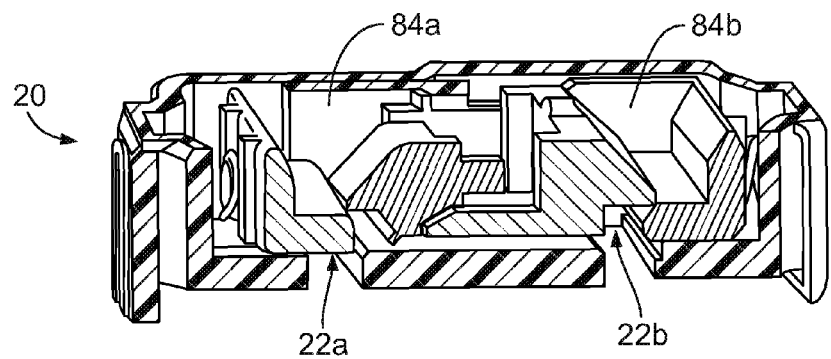
FIG. 1 is a perspective, cross-sectional view of a prior art tamper-resistant receptacle.
Figure 2:
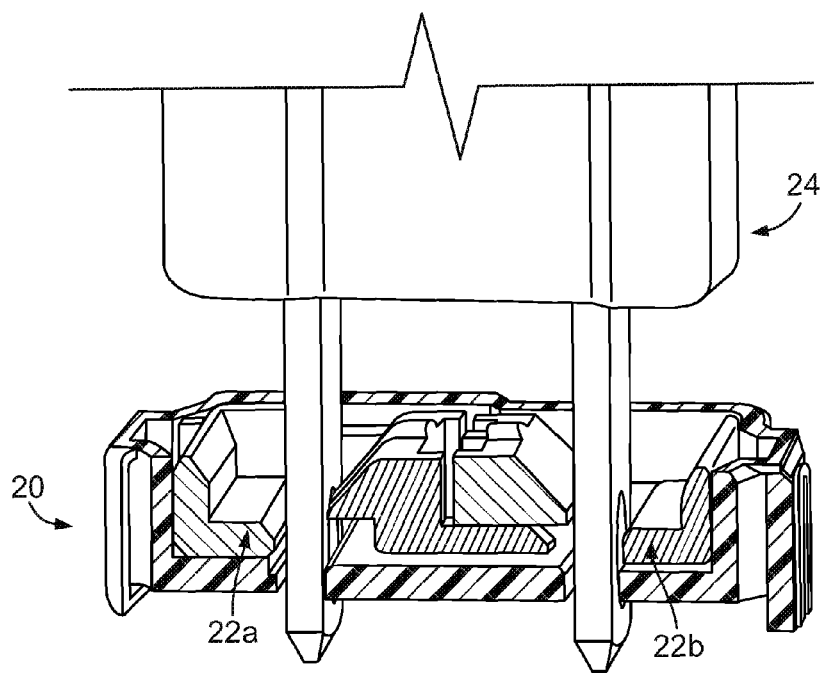
FIG. 2 is a perspective, cross-sectional view of the prior art tamper-resistant receptacle with a plug being inserted.
Figure 3:
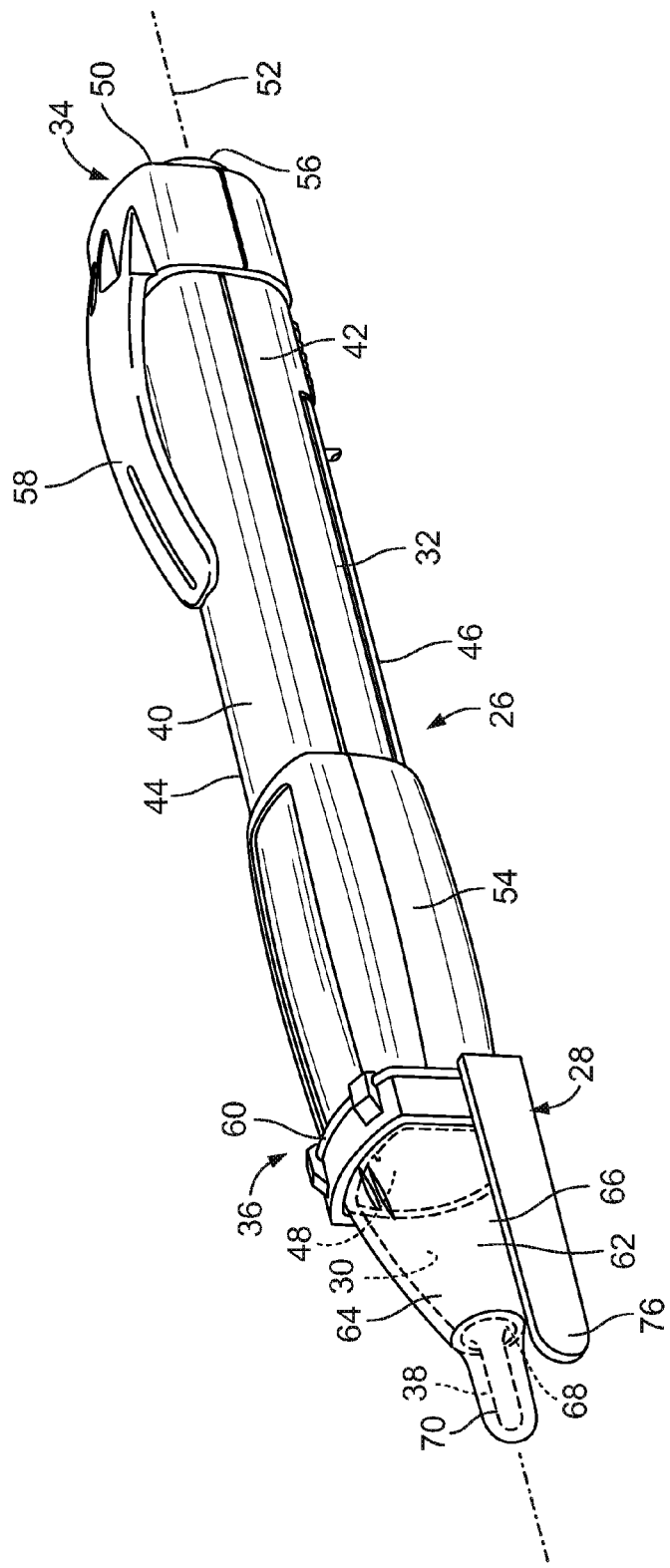
FIG. 3 is a perspective view of a first embodiment of a device which includes a prior art voltage detector and a novel safety extension which incorporates the features of the present invention.
Figure 4:
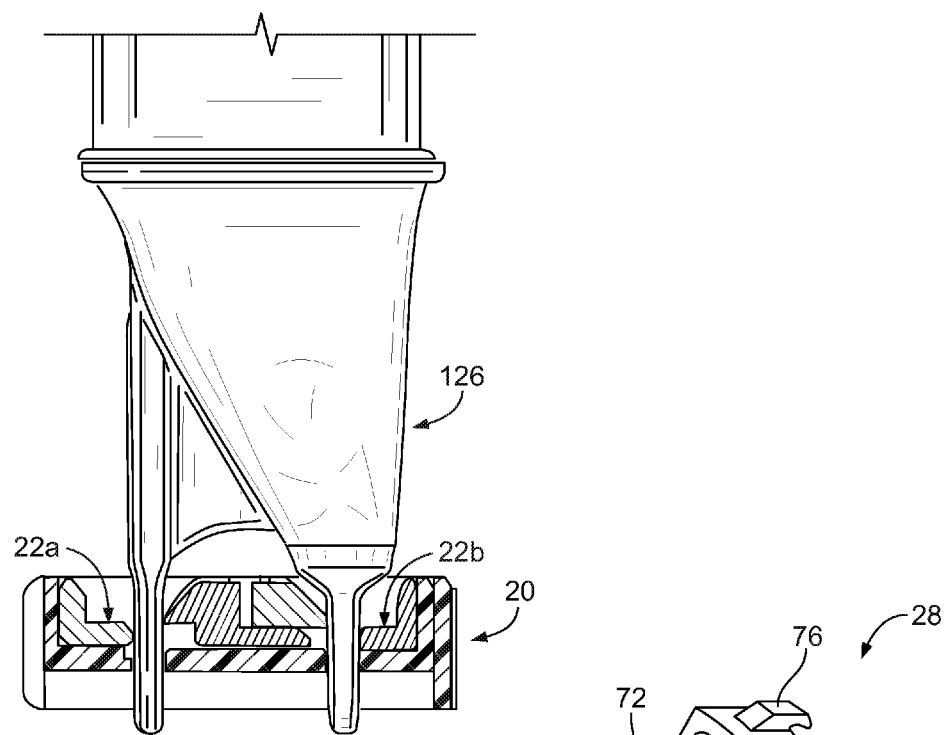
FIG. 4 is a cross-sectional view of a second embodiment of a voltage detector being inserted into the prior art tamper-resistant receptacle.
Figure 5:
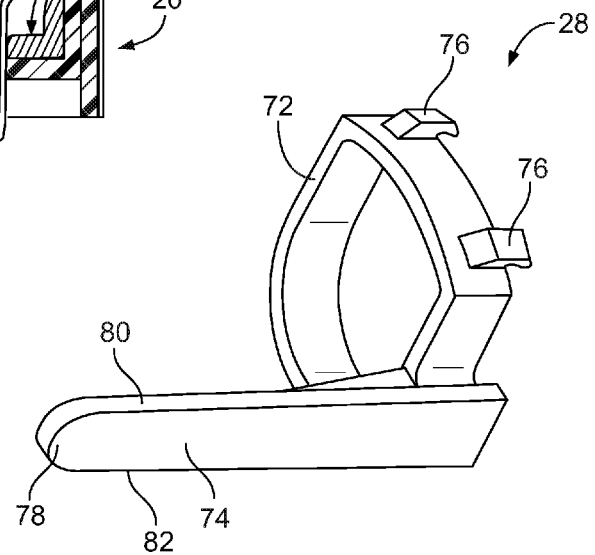
FIG. 5 is a perspective view of the safety extension of FIG. 3.
Figure 6:
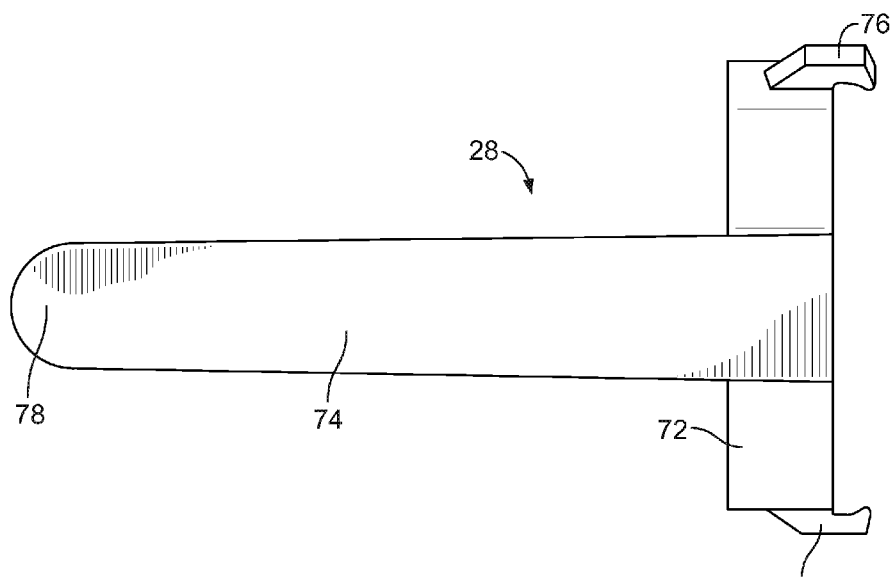
FIGS. 6-8 are side elevational views of the safety extension of FIG. 3.
Figure 7:
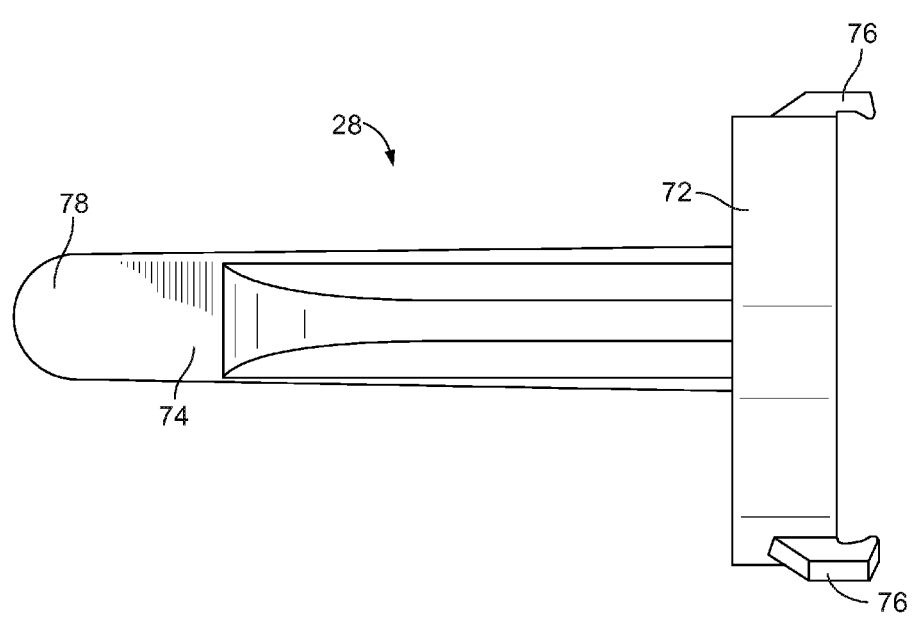
Figure 8:
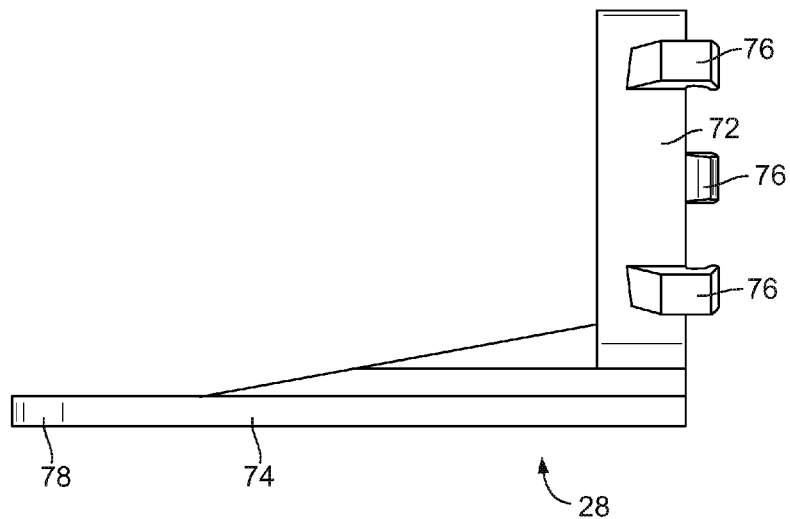
Figure 9:
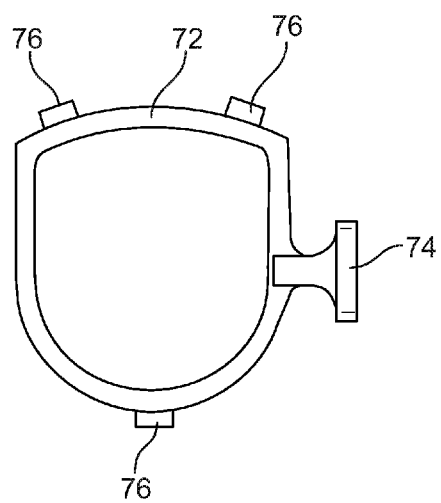
FIG. 9 is a rear plan view of the safety extension of FIG. 3.
Figure 10:
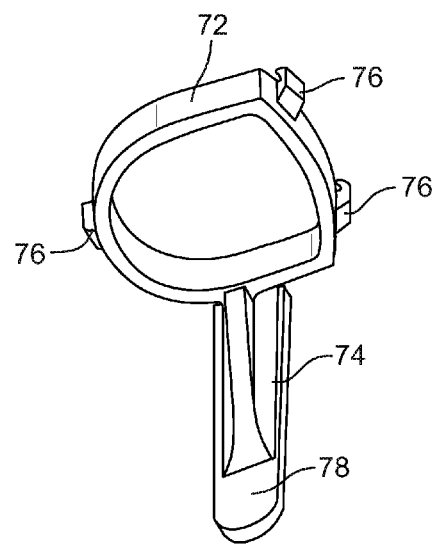
FIG. 10 is a perspective view of the safety extension of FIG. 3.
Figure 11:
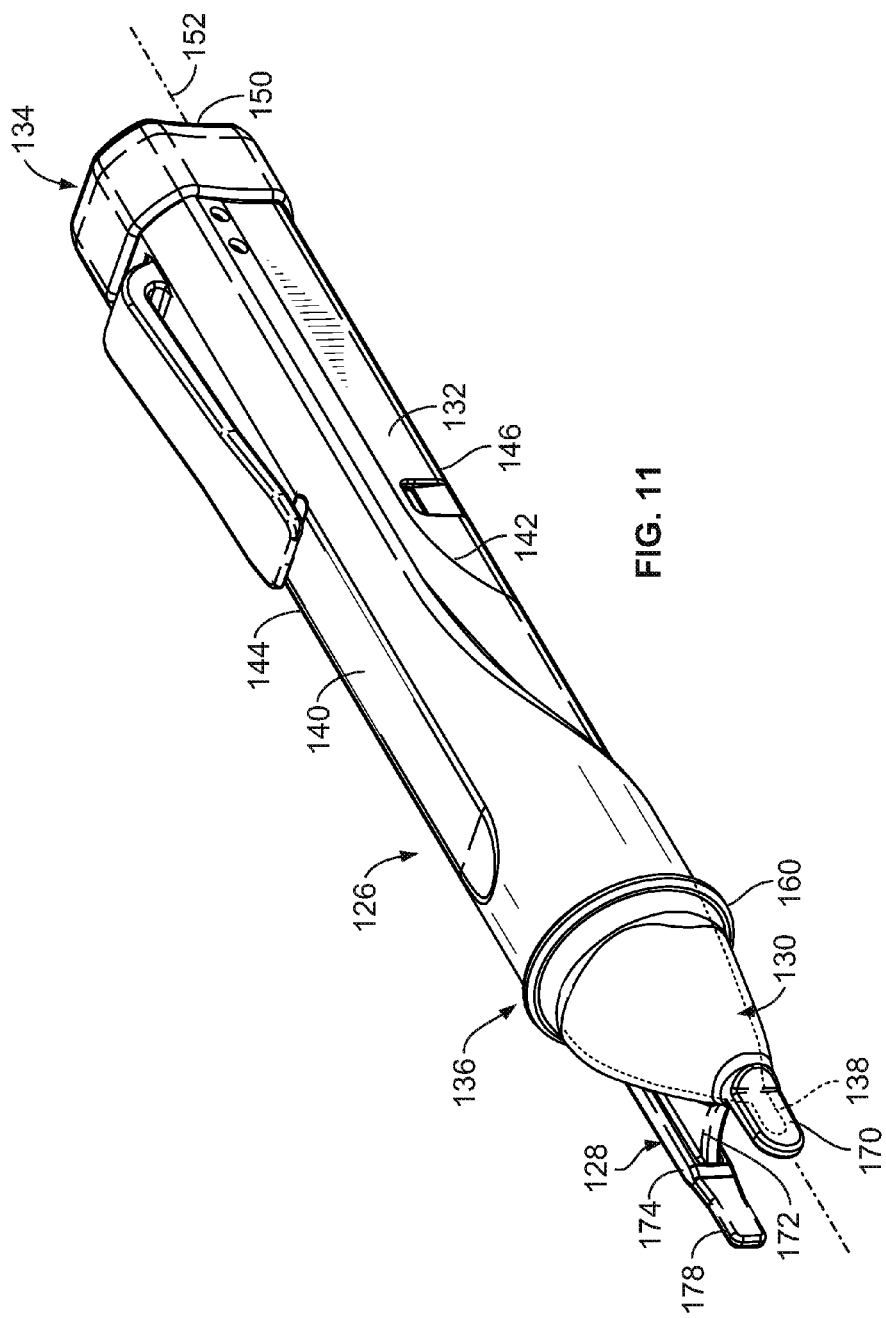
FIG. 11 is a perspective view of a second embodiment of a device which includes a voltage detector with an integral safety extension which incorporates the features of the present invention.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein. Therefore, unless otherwise noted, features disclosed herein may be combined together to form additional combinations that were not otherwise shown for purposes of brevity.

A first embodiment of a non-contact, hand-held voltage detector 26 with a safety extension 28 is shown in FIGS. 3 and 5-10; a second embodiment of a non-contact, hand-held voltage detector 126 with a safety extension 128 is shown in FIGS. 4 and 11-14. The non-contact, hand-held voltage detector 26, 126 is used to determine if AC voltage is present in a tamper-resistant receptacle 20.

Attention is invited to the embodiment of the voltage detector 26 with its attached safety extension 28 shown in FIGS. 3 and 5-10. The voltage detector 26 of this embodiment is known in the prior art, and is sold by Greenlee Textron Inc, under Catalog No. GT-12. The voltage detector 26 includes an elongated, non-conductive housing 32 having a distal end 34 and a proximal end 36 and a conductive contact 38 extending from the proximal end 36 of the housing 32. A non-conductive cap 30 is attached to the proximal end 36 of the housing 32 and covers the conductive contact 38.

The housing 32 is preferably formed of plastic and has a top wall 40, side walls 42, 44 and a bottom wall 46 which are connected together. The housing 32 has a front end 48 at the proximal ends of the walls 40, 42, 44, 46 and through which the contact 38 extends and a rear wall 50 closing the distal ends of the walls 40, 42, 44, 46. A centerline 52 of the housing 32 runs between the distal end 34 and the proximal end 36. Each wall 40, 42, 44, 46 is substantially flat, such that a generally square cross-section is provided. If desired, a rubber overlay can be provided on the housing. The housing 32 may take other shapes as its perimeter.

A depressible button 56 is provided at the rear wall 50 which, when depressed, turns the voltage detector 26 on. A clip member 58 is provided at the distal end 34 and extends proximally along the top wall 40 of the housing 32. The clip member 58 can be used to hang the voltage detector 26 in a shirt pocket.

The conductive contact 38 is preferably formed of metal and is formed from a blade having wide flat sides and narrow edges connecting the flat sides along the top, bottom and front of the contact as is known in the art. A tester circuit (not shown), which is known in the art as shown in U.S. Pat. No. 7,733,078 which disclosure is herein incorporated by reference, is provided within the housing 32 and is electrically connected to the contact 38. The tester circuit includes a speaker (not shown) for sounding a beep or other sound when AC voltage is detected by the voltage detector 26, and/or an indicator light (not shown) which illuminates when AC voltage is detected by the voltage detector 26.

The cap 30 is formed of plastic and attaches to the proximal end 36 of the housing 32 and overlays the contact 38 in a known manner. The cap 30 has a square flange 60 which mates with the proximal end 36 of the housing 32, a square extension (not shown) extending distally from one side of the flange 60 and which conforms in shape to the proximal end 36 of the housing 32, and a generally conical wall 62 extending from the other side of the flange 60. The generally conical wall 62 has a tapered first portion 64 and a tapered second portion 66. The first portion 64 tapers at a much steeper angle relative to the centerline 52 of the housing 32 than the angle at which the second portion 66 tapers relative to the centerline 52 of the housing 32. The first portion 64 is proximate to the top wall 40 and the side walls 42, 44 of the housing 32. The second portion 66 is proximate to the bottom wall 46 of the housing 32. As a result, the proximal end 68 of the generally conical wall 62 is offset from the centerline 52 of the housing 32. The proximal end 68 of the generally conical wall 62 has a contact-holding pin 70 extending therefrom. The contact-holding pin 70 generally conforms in shape to the contact 38, such that it includes wide flat sides and narrow edges connecting the flat sides along the top, bottom and front thereof. The contact-holding pin 70 is parallel to, but offset from, the centerline 52, as a result of the structure of the generally conical wall 62.

The safety extension 28 is formed as a separate member and is attached to the cap 30. The safety extension 28 includes a frame portion 72 which conforms in shape to the distal end of the generally conical wall 62 which is proximate to the flange 60, an arm 74 extending outwardly from the frame portion 72, and a plurality of spaced apart hooks 76 extending distally from the perimeter of the frame portion 72. The end of the arm 74 terminates in a rounded end which forms a pin 78. The arm 74 includes wide flat sides and narrow edges connecting the flat sides along the top, bottom and front thereof like that of the contact-holding pin 70. Preferably, the arm 74 is slightly thinner (from edge 80 to edge 82) than contact-holding pin 70.

In use, the frame portion 72 is slid over the contact-holding pin 70 and the proximal end 68 of the generally conical wall 62 until the frame portion 72 abuts against the flange 60. The hooks 76 engage over the flange 60 to securely hold the safety extension 28 on the generally conical wall 62. The arm 74 extends toward the proximal end of the cap 30 and is parallel to, but offset from, the centerline 52 of the housing 32. The arm 74 is aligned with the side wall 42. If desired, the safety extension 28 can be attached to the generally conical wall 62 by suitable means, such as ultrasonic welding.

The user depresses the button 56 to activate the voltage tester 26. The user inserts the pins 70, 78 into the vertical slots 84a, 84b of the tamper-resistant receptacle 20. The user's thumb is on top of the clip member 58 and the bottom wall 46 rests on the index and other fingers of the user. The voltage detector 26 can be easily held in one hand and manipulated using that same hand. The insertion of both pins 70, 78 into the tamper-resistant receptacle 20 causes both of the shutters 22a, 22b to open. If AC voltage is detected in the receptacle 20, the voltage detector 26 will sound a beep, and/or illuminate the light. If desired, the voltage detector 26 can remain off until it is inserted into the receptacle 20, that is the button 56 is depressed after insertion into the receptacle 20.

Attention is now invited to the embodiment of the voltage detector 126 and safety extension 128 shown in FIGS. 4 and 11-14. The voltage detector 126 includes an elongated, non-conductive housing 132 having a distal end 134 and a proximal end 136, a conductive contact 138 extending from the proximal end 136 of the housing 132, and a non-conductive cap 130 attached to the proximal end 136 of the housing 132 and which overlays the contact 138.

Figure 12:
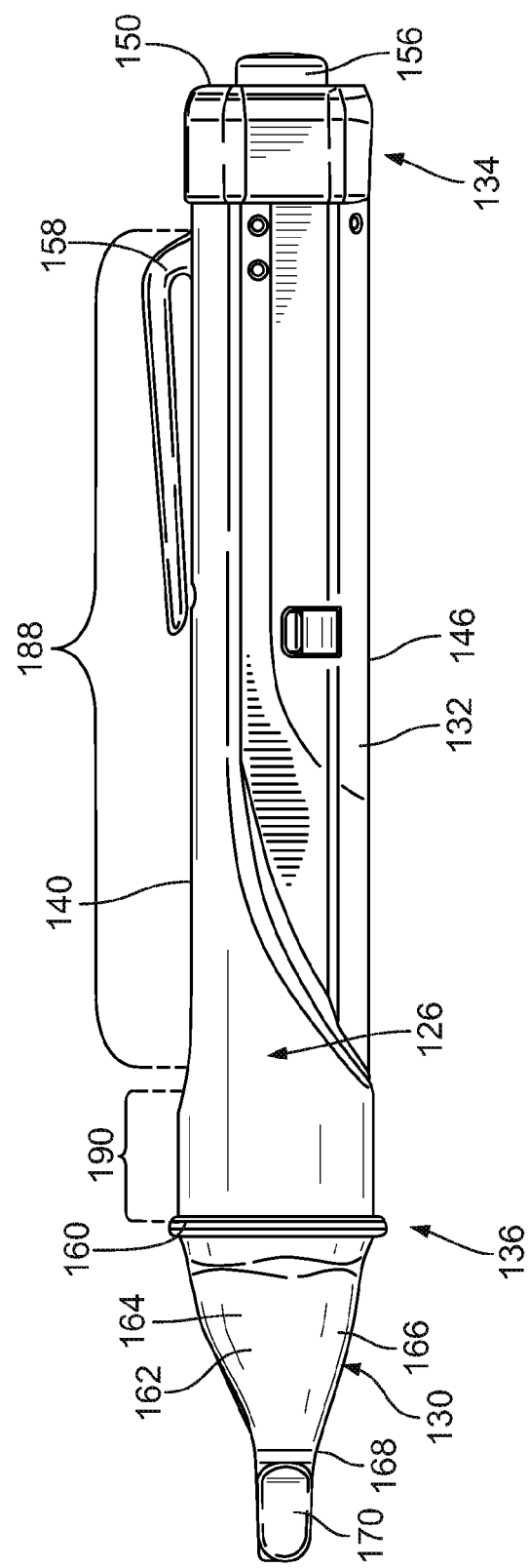
FIG. 12 is a side elevational view of the device of FIG. 11.

The housing 132 is preferably formed of plastic and has a top wall 140, side walls 142, 144 and a bottom wall 146 which are connected together. The housing includes a front end at the proximal ends of the walls 140, 142, 144, 146 and through which the contact 138 extends and a rear wall 150 closing the distal ends of the walls 140, 142, 144, 146. A centerline 152 of the housing 132 runs between the distal end 134 and the proximal end 136. A distal portion 188 of each wall 140, 142, 144, 146, see FIG. 12, is substantially flat, such that a generally square cross-section is provided. As shown in FIG. 12, the proximal portion 190 of each wall 140, 142, 144, 146 is circular, such that a generally circular cross-section is provided. It is to be understood that other shapes for the proximal portion 190 can be provided, such as square, rectangular, having two generally concave sides and two generally convex sides, etc. If desired, a rubber overlay can be provided on the housing.

A depressible button 156 is provided at the rear wall 150 which, when depressed, turns the voltage detector 126 on. A clip member 158 is provided at the distal end 134 and extends proximally along the top wall 140 of the housing 32. The clip member 158 can be used to hang the voltage detector 126 in a shirt pocket.

As is known in the art and as shown in the first embodiment, the contact 138 is formed from a blade having wide flat sides and narrow edges connecting the flat sides along the top, bottom and front of the contact 138. A tester circuit (not shown), which is known in the art as shown in U.S. Pat. No. 7,733,078 which disclosure is herein incorporated by reference, is provided within the housing 132 and is electrically connected to the contact 138. The tester circuit includes a speaker (not shown) for sounding a beep or other sound when AC voltage is detected by the voltage detector 126, and/or an indicator light (not shown) which illuminates when AC voltage is detected by the voltage detector 126.

Figure 13:
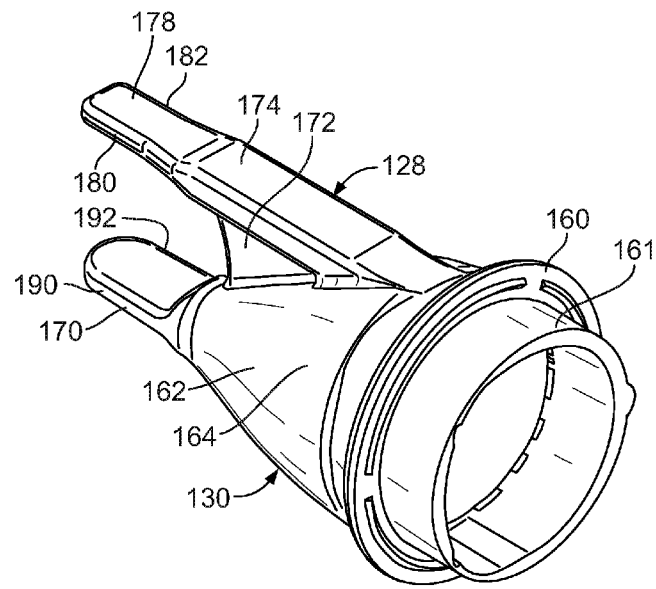
FIG. 13 is a perspective view of a cap which forms part of the voltage detector of FIG. 11.
Figure 14:
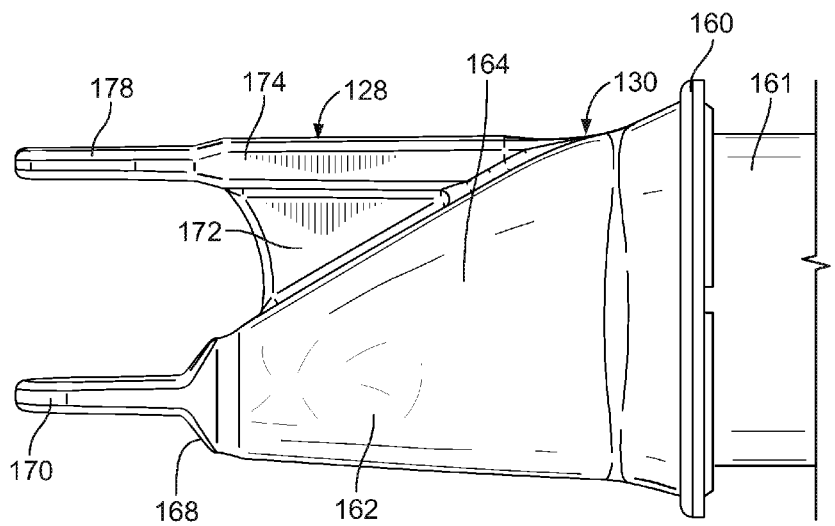
FIG. 14 is a side elevational view of the cap of FIG. 13.

The cap 130 is formed of plastic and the extension 161 seats in the proximal end 136 of the housing 132. The cap 130 overlays the contact 138. As best shown in FIG. 13, the cap 130 has an encircling flange 160, an extension 161 extending from one side of the flange 160 and which conforms in shape to the proximal end 136 of the housing 132 and a generally conical wall 162 extending from the other side of the flange 160. The generally conical wall 162 has a tapered first portion 164 and a tapered second portion 166. The first portion 164 tapers at a much steeper angle relative to the centerline 152 of the housing 32 than the angle at which the second portion 166 tapers relative to the centerline 152 of the housing 132. The first portion 164 is proximate to the top wall 140 and the side walls 142, 144 of the housing 132. The second portion 166 is proximate to the bottom wall 146 of the housing 132. As a result, the proximal end 168 of the generally conical wall 162 is offset from the centerline 152 of the housing 132. The proximal end 168 of the generally conical wall 162 has a contact-holding pin 170 extending therefrom. The contact-holding pin 170 generally conforms in shape to the contact 138, such that it includes wide flat sides and narrow edges connecting the flat sides along the top, bottom and front thereof. The contact-holding pin 170 is parallel to, but offset from, the centerline 152, as a result of the structure of the generally conical wall 162.

The safety extension 128 is formed as an integral part of the cap 130. The safety extension 128 includes a frame portion 172 which extends outwardly from the first portion 164 of the generally conical wall 162, and an arm 174 extending outwardly from the frame portion 172 and from the generally conical wall 162. The arm 174 is parallel to the centerline 152 of the housing 132. The arm 174 is proximate to the side wall 144. The end of the arm 174 terminates in a rounded end which forms a pin 178. The arm 174 includes wide flat sides and narrow edges connecting the flat sides along the top, bottom and front thereof like that of the contact-holding pin 170. Preferably, the arm 174 is slightly thinner (from edge 180 to edge 182) than contact-holding pin 170 (from edge 190 to edge 192).

The user depresses the button 156 to activate the voltage tester 126. The user inserts the pins 170, 178 into the vertical slots 84a, 84b of the tamper-resistant receptacle 20. The user's thumb is on top of the clip member 158 and the bottom wall 146 rests on the index and other fingers of the user. The voltage detector 126 can be easily held in one hand and manipulated using that same hand. The insertion of both pins 170, 178 into the tamper-resistant receptacle 20 causes both of the shutters 22a, 22b to open. If AC voltage is detected in the receptacle 20, the voltage detector 126 will sound a beep, and/or illuminate the light. If desired, the voltage detector 126 can remain off until it is inserted into the receptacle 20, that is the button 156 is depressed after insertion into the receptacle 20.

The housings 32, 132 are exemplary of designs which can be used in the non-contact, hand-held voltage detector 26, 126.

While preferred embodiments are shown and described, it is envisioned that those skilled in the art may devise various modifications of the present invention without departing from the spirit and scope of the appended claims.

What is claimed is:

1. A device for determining whether AC voltage is present in a tamper-resistant receptacle having a pair of shutters therein, said device comprising:
    a voltage detector having a non-conductive housing which defines a centerline, a conductive contact extending from said housing, and a non-conductive cap attached to said housing and covering said contact, said cap terminating in a non-conductive pin covering an end portion of said contact; and
    a non-conductive safety extension provided on said cap, said safety extension having an arm extending parallel to, but offset from, said pin, said arm and said pin being capable of being inserted into the tamper-resistant receptacle to open the shutters of the tamper-resistant receptacle.

2. The device of claim 1, wherein said contact is offset from said centerline.

3. The device of claim 1, wherein said safety extension is integrally formed with said cap.

4. The device of claim 3, wherein said cap includes a conical wall extending from said housing, said pin extending from said wall.

5. The device of claim 3, wherein said arm is thinner than said pin.

6. The device of claim 1, wherein said arm is thinner than said pin.

7. A device for determining whether AC voltage is present in a tamper-resistant receptacle having a pair of shutters therein, said device comprising:
    a voltage detector having a non-conductive housing which defines a centerline, a conductive contact extending from said housing, and a non-conductive cap attached to said housing and covering said contact, said cap terminating in a non-conductive pin covering an end portion of said contact; and
    a safety extension provided on said cap, said safety extension having an arm extending parallel to, but offset from, said pin, said arm and said pin being capable of being inserted into the tamper-resistant receptacle to open the shutters of the tamper-resistant receptacle, said safety extension is formed as a separate member from said cap and is attached to said cap.

8. The device of claim 7, wherein said safety extension is formed from a frame portion which conforms in shape to a portion of said cap, said arm extending outwardly from said frame portion, and a plurality of spaced apart hooks extending distally from said frame portion.

9. The device of claim 8, wherein said cap includes a wall extending from said housing, said pin extending from said wall, and a flange extending outwardly from said wall, said hooks engaging with said flange to mate said safety extension with said cap.

10. The device of claim 9, wherein said wall is conical.

11. The device of claim 10, wherein said arm is thinner than said pin.

12. The device of claim 7, wherein said arm is thinner than said pin.

* * * * *